(12) United States Patent
Matsuda

(10) Patent No.: US 10,396,271 B2
(45) Date of Patent: Aug. 27, 2019

(54) PIEZOELECTRIC ELEMENT, METHOD OF FORMING PIEZOELECTRIC ELEMENT, AND ULTRASONIC DEVICE

(71) Applicant: Seiko Epson Corporation, Tokyo (JP)

(72) Inventor: Hiroshi Matsuda, Gifu (JP)

(73) Assignee: Seiko Epson Corporation (JP)

( * ) Notice: Subject to any disclaimer, the term of this patent is extended or adjusted under 35 U.S.C. 154(b) by 295 days.

(21) Appl. No.: 15/353,854

(22) Filed: Nov. 17, 2016

(65) Prior Publication Data

US 2017/0155030 A1 Jun. 1, 2017

(30) Foreign Application Priority Data

Nov. 30, 2015 (JP) ................................. 2015-232820

(51) Int. Cl.
| | |
|---|---|
| *H01L 41/047* | (2006.01) |
| *H01L 41/09* | (2006.01) |
| *H01L 41/27* | (2013.01) |
| *B06B 1/06* | (2006.01) |
| *H01L 41/08* | (2006.01) |
| *H01L 41/29* | (2013.01) |
| *H01L 41/332* | (2013.01) |

(52) U.S. Cl.
CPC ............ *H01L 41/09* (2013.01); *B06B 1/0622* (2013.01); *H01L 41/047* (2013.01); *H01L 41/0471* (2013.01); *H01L 41/0805* (2013.01); *H01L 41/0973* (2013.01); *H01L 41/27* (2013.01); *H01L 41/29* (2013.01); *H01L 41/332* (2013.01)

(58) Field of Classification Search
CPC ... H01L 41/09; H01L 41/047; H01L 41/0471; H01L 41/0805; H01L 41/0973; H01L 41/27; H01L 41/29; H01L 41/332; B06B 1/0622
USPC ......................................... 310/328, 365, 369
See application file for complete search history.

(56) References Cited

U.S. PATENT DOCUMENTS

| | | | | |
|---|---|---|---|---|
| 5,281,888 | A * | 1/1994 | Takeuchi | ............ H01L 41/0475 310/358 |
| 6,661,162 | B1 | 12/2003 | Nagai et al. | |
| 6,831,723 | B1 | 12/2004 | Takeuchi | |
| 2003/0048046 | A1* | 3/2003 | Yamaguchi | ......... H01L 41/0973 310/358 |
| 2003/0062807 | A1* | 4/2003 | Takeuchi | .............. B81B 3/0035 310/358 |

(Continued)

FOREIGN PATENT DOCUMENTS

| | | |
|---|---|---|
| JP | 2000-173999 A | 6/2000 |
| JP | 2000-183287 A | 6/2000 |

(Continued)

*Primary Examiner* — Thomas M Dougherty
(74) *Attorney, Agent, or Firm* — Harness, Dickey & Pierce, P.L.C.

(57) ABSTRACT

A piezoelectric element includes a piezoelectric body that is provided on a substrate and includes multiple sides; a first wiring that is provided from the piezoelectric body to the substrate; and a second wiring that is provided from the piezoelectric body to the substrate. When the piezoelectric element is viewed from a thickness direction of the piezoelectric body, a second side and a fourth side on which the piezoelectric body is superimposed on the first wiring are different from a first side and a third side on which the second wiring is superimposed on the piezoelectric body.

2 Claims, 12 Drawing Sheets

(56) References Cited

U.S. PATENT DOCUMENTS

| | | | |
|---|---|---|---|
| 2006/0170718 A1* | 8/2006 | Takahashi | B41J 2/17566 |
| | | | 347/7 |
| 2006/0267711 A1* | 11/2006 | Yanase | H03H 3/02 |
| | | | 333/187 |
| 2011/0298564 A1* | 12/2011 | Iwashita | H03H 3/02 |
| | | | 333/187 |
| 2014/0104989 A1* | 4/2014 | Matsuda | G01N 29/0654 |
| | | | 367/138 |
| 2014/0187956 A1* | 7/2014 | Rice | B06B 1/0662 |
| | | | 600/459 |
| 2014/0267508 A1* | 9/2014 | Ohashi | B41J 2/14233 |
| | | | 347/70 |
| 2015/0094590 A1 | 4/2015 | Kiyose et al. | |
| 2015/0200647 A1 | 7/2015 | Okamoto et al. | |
| 2015/0258573 A1* | 9/2015 | Kojima | G10K 11/002 |
| | | | 310/327 |
| 2017/0087843 A1* | 3/2017 | Mikoshiba | B41J 2/1628 |
| 2018/0277738 A1* | 9/2018 | Ohashi | H01L 41/047 |

FOREIGN PATENT DOCUMENTS

| | | |
|---|---|---|
| JP | 2001-144581 A | 5/2001 |
| JP | 2001-222020 A | 8/2001 |
| JP | 2002-094016 A | 3/2002 |
| JP | 2015-066202 A | 4/2015 |
| WO | WO-2014-050235 A1 | 4/2014 |

* cited by examiner

PIEZOELECTRIC ELEMENT, METHOD OF FORMING PIEZOELECTRIC ELEMENT, AND ULTRASONIC DEVICE

BACKGROUND

1. Technical Field

The present invention relates to a piezoelectric element, a method of forming a piezoelectric element, and an ultrasonic device.

2. Related Art

A piezoelectric body which is deformed when a voltage is applied thereto is widely used. Two or more electrodes are installed on the piezoelectric body. If a voltage is applied between the electrodes, the piezoelectric body is deformed. In addition, when the piezoelectric body is deformed, a voltage difference occurs between two electrodes. It is possible to generate ultrasonic waves using properties of the piezoelectric body. In addition, it is possible to detect ultrasonic waves by analyzing a change in voltage difference between the electrodes when the piezoelectric body receives the ultrasonic waves and vibrates.

International Publication No. 2014-050235 discloses a piezoelectric element in which electrodes are installed on a piezoelectric body. The piezoelectric body has a plate shape, and a front surface and a rear surface are parallel to each other. A first electrode is installed on the front surface, and a second electrode is installed on the rear surface. The planar shape of the piezoelectric body is a rectangular shape, and includes four sides. One side of the four sides is assumed to be a first side.

The first electrode is connected to a first terminal on the rear surface via a first wiring passing through the first side. The second electrode is connected to a second terminal on the front surface via a second wiring passing through the first side. The first wiring and the second wiring are disposed along the first side. The piezoelectric element is mounted on a substrate, and a third terminal and a fourth terminal are installed on the substrate. The first terminal is connected to the third terminal, and the second terminal is connected to the fourth terminal.

In the piezoelectric element disclosed in International Publication No. 2014-050235, the first wiring and the second wiring are installed along one side. A method of patterning a piezoelectric body via a photolithographic method, and performing etching is effective in disposing a very small piezoelectric element on a substrate. When a resist is disposed on a piezoelectric body, and patterning and etching are performed, chemical reactions occur between etching gas, the resist, and the piezoelectric body. A compound is formed due to the chemical reactions. If the piezoelectric body has a rectangular shape, a compound is formed along each of four sides. Side surfaces of the piezoelectric body become substantially perpendicular to an upper surface of the piezoelectric body due to the compound. It is possible to limit a side surface, on which the compound is formed, to one side surface by spraying a chemical solution to the compound. That is, if the piezoelectric body includes four side surfaces, it is possible to allow the formation of the compound on only one surface. The compound is also referred to as a fence.

Wirings are installed from the upper surface of the piezoelectric body to the substrate. In this case, after a metallic film and a resist are installed and patterning is performed, etching is performed. In this case, a residual of the metallic film remains on a substantially perpendicular side surface. If two or more wirings are installed in a location where a residual of the metallic film is present, the wirings are short-circuited to each other, and the piezoelectric element malfunctions. Desirably, in the piezoelectric element, it is possible to prevent a short circuit between the first wiring and the second wiring which are installed in the piezoelectric body, which is caused by a residual of the metallic film.

SUMMARY

An advantage of some aspects of the invention is to solve the problems described above, and the invention can be implemented as the following aspects or application examples.

APPLICATION EXAMPLE 1

A piezoelectric element according to this application example includes: a piezoelectric body that is provided on a substrate and includes multiple sides; a first wiring that is provided from the piezoelectric body to the substrate; and a second wiring that is provided from the piezoelectric body to the substrate. When the piezoelectric element is viewed from a thickness direction of the piezoelectric body, sides on which the piezoelectric body is superimposed on the first wiring are different from sides on which the second wiring is superimposed on the piezoelectric body.

According to this application example, the piezoelectric element includes the substrate, and the piezoelectric body is provided on the substrate. The piezoelectric body includes the multiple sides. The first wiring and the second wiring are provided from the piezoelectric body to the substrate. When the piezoelectric element is viewed from the thickness direction of the piezoelectric body, the sides on which the piezoelectric body is superimposed on the first wiring are different from the sides on which the second wiring is superimposed on the piezoelectric body.

The exterior of the piezoelectric body is formed by installing a resist having the same shape as the exterior shape of the piezoelectric body, and performing dry etching. Side surfaces of the piezoelectric body are formed inclined. In this case, the resist, an etching atmosphere, and the material of the piezoelectric body react with each other, and a compound having a protruding shape grows along the exterior of the piezoelectric body. The compound protrudes in the thickness direction of the piezoelectric body. The side surfaces of the piezoelectric body are at substantially right angles to a plane of the substrate due to the compound. A chemical solution is sprayed to remove the compound. In this case, it is possible to set a probability of the compound remaining on only one side of the multiple sides to be higher than a probability of the compound remaining on two or more sides.

The first wiring and the second wiring are formed by dry etching the same metallic film. Since a side surface containing a side on which the compound is present is a steep slope surface, a residual of the metallic film may remain. In this application example, since the first wiring and the second wiring are provided on different sides, one of the first wiring and the second wiring is provided on a side surface having a low probability that the compound remains thereon. A residual of the metallic film does not remain on a side surface on which the compound does not remain. Accordingly, the structure of the piezoelectric element is capable of preventing a short circuit between the first wiring and the second wiring caused by the residual of the metallic film.

APPLICATION EXAMPLE 2

In the piezoelectric element according to the application example, the piezoelectric body includes a first side on which the first wiring is provided, and a second side on which the second wiring is provided, and the first side is orthogonal to the second side.

According to this application example, the piezoelectric body includes the first side and the second side. The first side is orthogonal to the second side. Since a normal direction of the first side is different from that of the second side, it is possible to increase a probability of removing the compound from one side by spraying the chemical solution to the sides.

APPLICATION EXAMPLE 3

In the piezoelectric element according to the application example, the first wiring contains a lower wiring that is provided between the substrate and the piezoelectric body, and an upper wiring that is provided from an upper side of the piezoelectric body to the lower wiring.

According to this application example, the first wiring includes the lower wiring and the upper wiring. The lower wiring is provided on the substrate, and the piezoelectric body is provided on the lower wiring. The upper wiring is provided from the upper side of the piezoelectric body to the upper side of the lower wiring. When the piezoelectric body is provided, the piezoelectric body is formed via etching. Even if the thickness of the lower wiring at a location where the piezoelectric body is not superimposed on the lower wiring is decreased, the upper wiring is capable of preventing a decrease in resistance of the first wiring.

APPLICATION EXAMPLE 4

A piezoelectric element according to this application example includes: a substrate; a piezoelectric body that is provided on the substrate, and has a curved exterior when viewed from a thickness direction; a first wiring that is provided from a first position on the piezoelectric body to the substrate; and a second wiring that is provided from a second position on the piezoelectric body to the substrate. The angle formed by a normal direction of the exterior at the first position and a normal direction of the exterior at the second position is 90 degrees or more and 270 degrees or less.

According to this application example, the piezoelectric element includes the substrate, and the piezoelectric body is provided on the substrate. The piezoelectric body has a curved exterior when viewed from the thickness direction. The first wiring and the second wiring are provided from the piezoelectric body to the substrate. The first wiring is disposed from the first position on the piezoelectric body to the substrate, and the second wiring is disposed from the second position on the piezoelectric body to the substrate. The angle formed by the normal direction of the exterior at the first position and the normal direction of the exterior at the second position is 90 degrees or more and 270 degrees or less.

The exterior of the piezoelectric body is formed by installing a resist having the same shape as the exterior shape of the piezoelectric body, and performing dry etching. Side surfaces of the piezoelectric body are formed inclined. In this case, the resist, an etching atmosphere, and the material of the piezoelectric body react with each other, and a compound having a protruding shape grows along the exterior of the piezoelectric body. The compound protrudes in the thickness direction of the piezoelectric body. The side surfaces of the piezoelectric body are at substantially right angles to a plane of the substrate due to the compound. A chemical solution is sprayed to remove the compound. In a case where the angle formed by the normal direction of the exterior at the first position and the normal direction of the exterior at the second position is set to 90 degrees or greater and 270 degrees or less, it is possible to decrease a probability of the compound remaining from the first position to the second position in comparison with that in a case where the angle is an acute angle.

The first wiring and the second wiring are formed by dry etching the same metallic film. Since a side surface containing a side on which the compound is present is a steep slope surface, a residual of the metallic film may remain. In this application example, the first wiring and the second wiring are provided at positions facing different directions, and a probability of the compound remaining from the first wiring to the second wiring is low. A residual of the metallic film is unlikely to remain on a side surface on which the compound does not remain. Accordingly, the structure of the piezoelectric element is capable of preventing a short circuit between the first wiring and the second wiring caused by the residual of the metallic film.

APPLICATION EXAMPLE 5

A method of forming a piezoelectric element according to this application example includes: forming the exterior of a piezoelectric body, which includes multiple sides, by dry etching the piezoelectric body provided on a substrate; spraying a chemical solution to a compound adhering to the exterior of the piezoelectric body so as to reduce the compound; installing a first wiring and a second wiring from the piezoelectric body to the substrate; and installing the first wiring and the second wiring on different sides.

According to this application example, the exterior of the piezoelectric body which includes the multiple sides is formed by dry etching the piezoelectric body provided on the substrate. Side surfaces of the piezoelectric body are formed inclined. In this case, a resist, an etching atmosphere, and the material of the piezoelectric body react with each other, and a compound having a protruding shape grows along the exterior of the piezoelectric body. The compound protrudes in the thickness direction of the piezoelectric body. The side surfaces of the piezoelectric body are at substantially right angles to a plane of the substrate due to the compound.

The chemical solution is sprayed to the compound adhering to the exterior of the piezoelectric body so as to reduce the compound. In this case, a probability of the compound remaining on one side of the multiple sides is higher than a probability of the compound remaining on two or more sides. Subsequently, the first wiring and the second wiring are installed on different sides.

The first wiring and the second wiring are formed by dry etching the same metallic film. Since a side surface containing a side on which the compound is present is a steep slope surface, a residual of the metallic film may remain. In this application example, since the first wiring and the second wiring are provided at different sides, one of the first wiring and the second wiring is provided on a side surface on which the compound does not remain. The residual of the metallic film does not remain on a side surface on which the compound does not remain. Accordingly, the structure of the piezoelectric element is capable of preventing a short circuit between the first wiring and the second wiring caused by the residual of the metallic film.

APPLICATION EXAMPLE 6

In the method of forming a piezoelectric element according to the application example, the first wiring contains a lower wiring and an upper wiring, installation is performed before the exterior of the piezoelectric body is formed, the lower wiring is installed on the substrate, the piezoelectric body is installed on the lower wiring, and the upper wiring is installed from an upper side of the piezoelectric body to an upper side of the lower wiring.

According to this application example, the first wiring contains the lower wiring and the upper wiring. The lower wiring is installed on the substrate before the exterior of the piezoelectric body is formed. The piezoelectric body is installed on the lower wiring. Subsequently, the upper wiring is provided from the upper side of the piezoelectric body to the upper side of the lower wiring. When the upper wiring is installed, the shape of the upper wiring is formed via etching. The upper wiring is capable of preventing an increase in electric resistance of the lower wiring which is caused by a decrease in the thickness of the lower wiring due to the etching of the piezoelectric body.

APPLICATION EXAMPLE 7

An ultrasonic device according to this application example includes: a vibrating plate that outputs ultrasonic waves; and a piezoelectric element that vibrates the vibrating plate. The piezoelectric element is the aforementioned piezoelectric element.

According to this application example, the ultrasonic device includes the vibrating plate, and the vibrating plate vibrates and outputs ultrasonic waves. The aforementioned piezoelectric element is provided on the vibrating plate. A short circuit between wirings in the aforementioned piezoelectric element is prevented. Accordingly, the ultrasonic device can be configured as a device including a piezoelectric element in which a short circuit between wirings is prevented.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
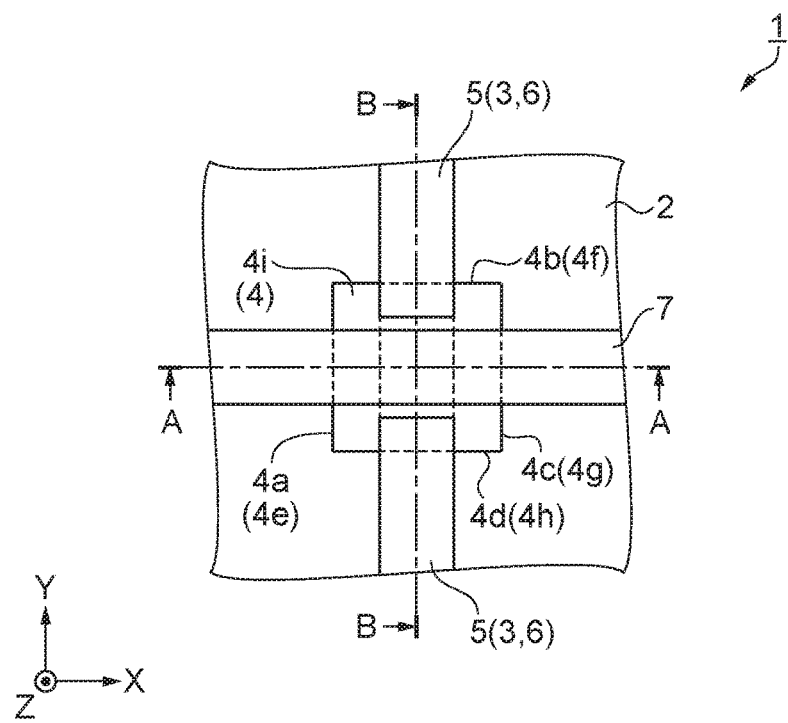
FIG. 1 is a schematic top view illustrating the structure of a piezoelectric element of a first embodiment.

Hereinafter, embodiments will be described with reference to the accompanying drawings. Since the dimensions of each member are scaled in the drawings such that each member can be recognized in the drawing, each member is illustrated at different scales in the drawings.

First Embodiment

Figure 2:
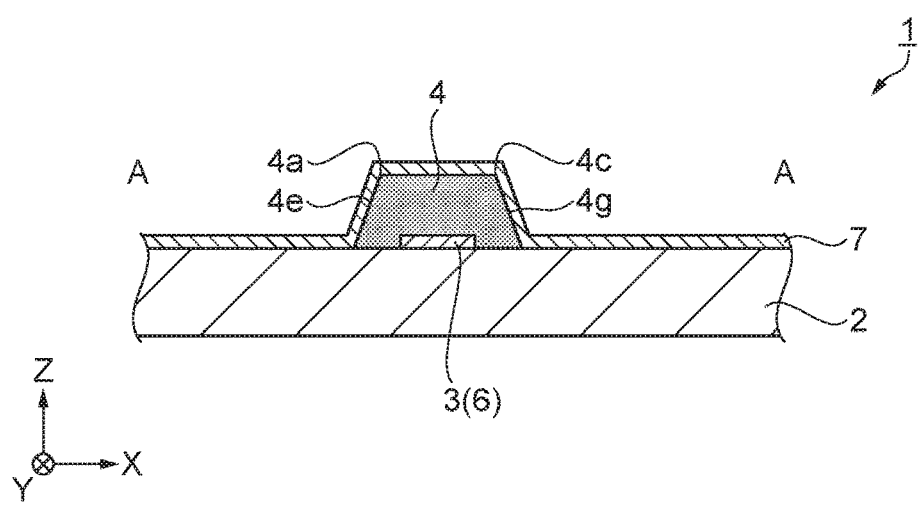
FIG. 2 is a schematic side sectional view illustrating the structure of the piezoelectric element.
Figure 3:
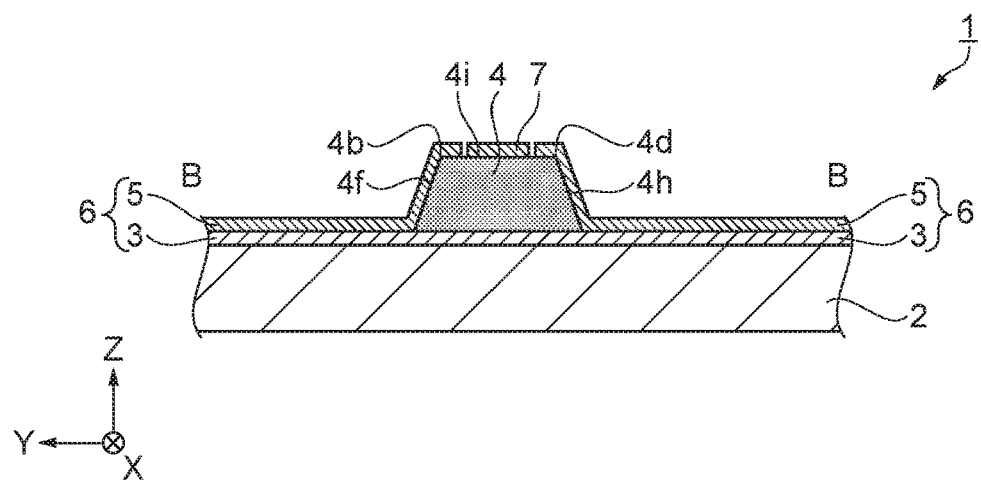
FIG. 3 is a schematic side sectional view illustrating the structure of the piezoelectric element.

In an embodiment, a distinguishing piezoelectric element and a distinguishing example of manufacturing a piezoelectric element will be described with reference to the accompanying drawings. A piezoelectric element of a first embodiment will be described with reference to FIGS. 1 to 3. FIG. 1 is a schematic top view illustrating the structure of the piezoelectric element. FIG. 2 is a schematic side sectional view illustrating the structure of the piezoelectric element, and is a side view taken along line A-A in FIG. 1. FIG. 3 is a schematic side sectional view illustrating the structure of the piezoelectric element, and is a side view taken along line B-B in FIG. 1.

As illustrated in FIGS. 1 to 3, a piezoelectric element 1 includes a substrate 2. A lower wiring 3 is installed on the substrate 2. A thickness direction of the substrate 2 is referred to as a Z direction, an extending direction of the lower wiring 3 on a plane of the substrate 2 is referred to as a Y direction. A direction orthogonal to the lower wiring 3 on the plane of the substrate 2 is referred to as an X direction.

A piezoelectric body 4 is installed on the lower wiring 3 in a state where a portion of the lower wiring 3 is covered with the piezoelectric element 4. In other words, the lower wiring 3 is provided between the substrate 2 and the piezoelectric body 4. The piezoelectric body 4 has a planar rectangular shape when viewed from the Z direction, and includes four sides. A side of the piezoelectric body 4 which is positioned in a −X direction is assumed to be a first side 4a, a side positioned in a +Y direction is assumed to be a second side 4b, a side facing a +X direction is assumed to be a third side 4c, and a side facing a −Y direction is assumed to be a fourth side 4d. The first side 4a to the fourth side 4d are equivalent to the sides. The piezoelectric body 4 includes four side surfaces, each of which contains a side. Each side surface is inclined with respect to two planes of the substrate 2. A surface facing the −X direction is assumed to be a first side surface 4e, a surface facing the +Y direction is assumed to be a second side surface 4f, a surface facing the +X direction is assumed to be a third side surface 4g, and a surface facing the −Y direction is assumed to be a fourth side surface 4h. The first side 4a to the fourth side 4d are respectively contained in the corresponding side surfaces.

An upper wiring 5 is installed at a location facing the lower wiring 3. Similar to the lower wiring 3, the upper wiring 5 is a wiring extending in the Y direction. A first wiring 6 includes the lower wiring 3 and the upper wiring 5. The upper wiring 5 is installed while being superimposed on the lower wiring 3 at a location where the piezoelectric body 4 is not positioned.

The upper wiring 5 is installed from the upper side of the lower wiring 3 to an upper surface 4i of the piezoelectric body 4 while passing through the second side surface 4f and the second side 4b. In addition, the upper wiring 5 is installed from the upper side of the lower wiring 3 to the upper surface 4i of the piezoelectric body 4 while passing through the fourth side surface 4h and the fourth side 4d. Accordingly, the first wiring 6 is provided from the piezoelectric body 4 to the substrate 2. The upper wiring 5 is divided on the upper surface 4i.

A second wiring 7 is installed on the upper surface 4i between the divided upper wirings 5. The second wiring 7 is a wiring extending in the X direction. The second wiring 7 is installed from the upper surface 4i of the piezoelectric body 4 to the upper side of the substrate 2 while passing through the first side surface 4e and the first side 4a. Similarly, the second wiring 7 is installed from the upper surface 4i of the piezoelectric body 4 to the upper side of the substrate 2 while passing through the third side surface 4g and the third side 4c. Accordingly, the second wiring 7 is provided from the piezoelectric body 4 to the substrate 2. In the embodiment, the first wiring 6 includes the lower wiring 3 and the upper wiring 5. Also, in a configuration in which the upper wiring 5 is not present, the piezoelectric element 1 acts as a piezoelectric element.

The lower wiring 3 of the first wiring 6 is installed on a substrate 2 side of the piezoelectric body 4. The second wiring 7 is installed on the upper surface 4i of the piezoelectric body 4. When a voltage is applied between the first wiring 6 and the second wiring 7, a voltage is applied to a location on the piezoelectric body 4 which is interposed between the first wiring 6 and the second wiring 7. The location on the piezoelectric body 4 to which the voltage is applied is deformed. In addition, when external force is applied to the piezoelectric body 4, and the piezoelectric body 4 is deformed, a voltage difference occurs between the first wiring 6 and the second wiring 7.

When the piezoelectric body 4 is viewed from the thickness direction, the second side 4b and the fourth side 4d of the piezoelectric body 4 are superimposed on the first wiring 6. In contrast, the first side 4a and the third side 4c of the piezoelectric body 4 are superimposed on the second wiring 7. Accordingly, the sides of the piezoelectric body 4 which are superimposed on the first wiring 6 are different from those of the piezoelectric body 4 which are superimposed on the second wiring 7.

When the piezoelectric body 4 is viewed from the thickness direction, the first side 4a is orthogonal to the second side 4b, and is orthogonal to the fourth side 4d. The third side 4c is orthogonal to the second side 4b, and is orthogonal to the fourth side 4d.

The piezoelectric body 4 is not limited to a specific material. In the embodiment, silicon dioxide or zirconium is used as the material of the substrate 2. A film in which an iridium film and a platina film are stacked on top of each other is used as the material of the first wiring 6 and the second wiring 7. Lead zirconate titanate (PZT) is used as the material of the piezoelectric body 4.

The piezoelectric element 1 is not limited to specific dimensions. In the embodiment, the piezoelectric body 4 has a width of 60 μm, and has a length corresponding to a frequency. The piezoelectric body 4 has a thickness of 1.3 μm. The first wiring 6 has a width of 10 μm to 40 μm, and a thickness of 400 nm. The second wiring 7 has a width of 40 μm to 120 μm, and a thickness of 60 nm.

Figure 4:
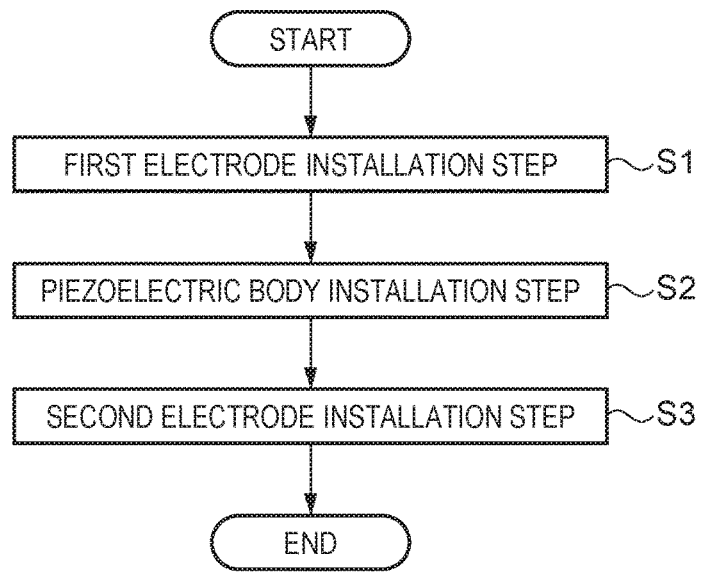
FIG. 4 is a flowchart illustrating a method of manufacturing a piezoelectric element.

Hereinafter, a method of manufacturing the piezoelectric element 1 will be described with reference to FIGS. 4 to 18. FIG. 4 is a flowchart illustrating the method of manufacturing a piezoelectric element. FIGS. 5 to 18 are schematic views illustrating the method of manufacturing a piezoelectric element. In the flowchart illustrated in FIG. 4, Step S1 is equivalent to a first electrode installation step, and is a step for installing the lower wiring 3 on the substrate 2. Subsequently, the process proceeds to Steps S2. Step S2 is a piezoelectric body installation step. This step is a step for installing the piezoelectric body 4 on the substrate 2 and the lower wiring 3. Subsequently, the process proceeds to Step S3. Step S3 is a second electrode installation step. This step is a step for installing the upper wiring 5 and the second wiring 7. A step for manufacturing the piezoelectric element 1 is completed by performing the aforementioned steps.

Figure 5:
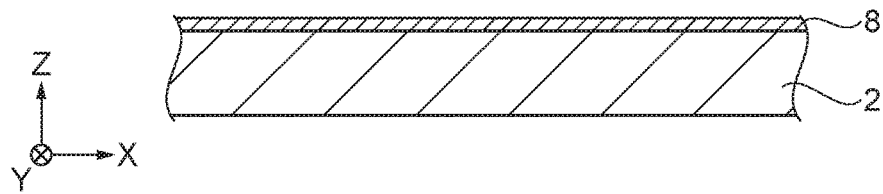
FIG. 5 is a schematic view illustrating the method of manufacturing a piezoelectric element.
Figure 6:
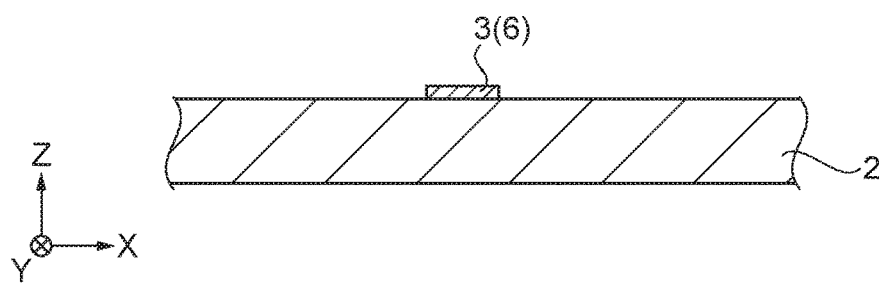
FIG. 6 is a schematic view illustrating the method of manufacturing a piezoelectric element.
Figure 7:
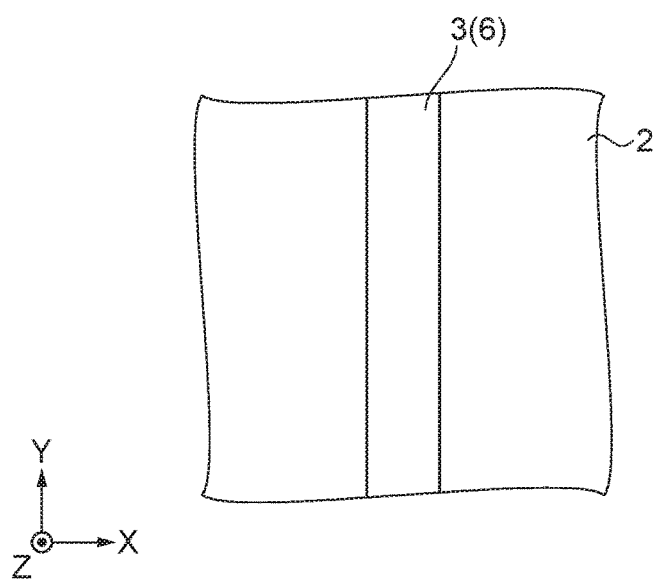
FIG. 7 is a schematic view illustrating the method of manufacturing a piezoelectric element.

Hereinafter, the manufacturing method will be described in detail with reference to FIGS. 5 to 18 corresponding to the steps illustrated in FIG. 4. FIGS. 5 to 7 are views corresponding to the first electrode installation step which is Step S1. As illustrated in FIG. 5, the substrate 2 is prepared. A metallic film 8 is installed on the substrate 2. In the embodiment, the metallic film 8 has a structure in which platinum is stacked on iridium oxide. The platinum is also referred to as platinum. A method of installing the metallic film 8 is not limited to a specific method. In the embodiment, for example, the metallic film 8 is installed via a sputtering method.

Subsequently, a photosensitive resist is installed on the metallic film 8, a mask having the shape of the lower wiring 3 is superimposed on the photosensitive resist, and a resultant object is exposed to light. Subsequently, the photosensitive resist is removed via etching, and a resist is removed by etching the metallic film 8. As a result, as illustrated in FIGS. 6 and 7, the lower wiring 3 is installed on the substrate 2.

Figure 8:
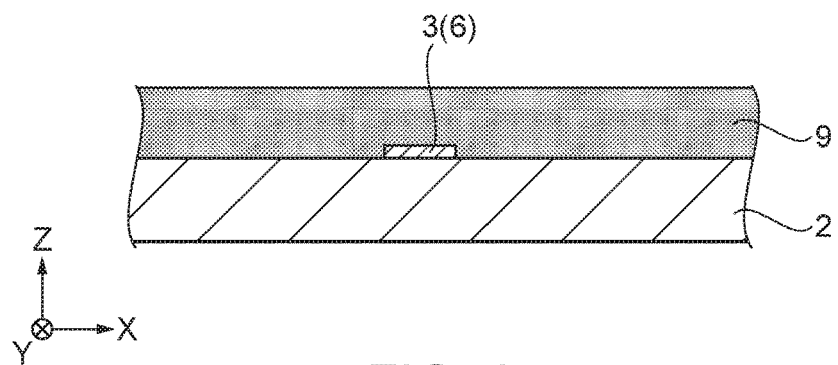
FIG. 8 is a schematic view illustrating the method of manufacturing a piezoelectric element.

FIGS. 8 to 15 are views corresponding to the piezoelectric body installation step which is Step S2. As illustrated in FIG. 8, a pyroelectric material layer 9 is installed. The pyroelectric material layer 9 is a layer that becomes the material of the piezoelectric body 4, and a PZT film layer. The pyroelectric material layer 9 is installed via a sputtering method or a sol-gel method. In a sputtering method, a PZT sintered compact of specific components is used as a sputtering target, and an amorphous piezoelectric-body precursor film is formed on the substrate 2 via sputtering.

Subsequently, the amorphous piezoelectric-body precursor film is heated, crystallized, and sintered. Heating is performed under an oxygen atmosphere containing oxygen or mixed gas of oxygen and inert gas such as argon. In a heating step, the piezoelectric-body precursor film is heated under an oxygen atmosphere at a temperature of 500° C. to 700° C. The piezoelectric-body precursor film is crystallized via heating.

In a sol-gel method, a sol which is a hydration complex of hydroxides of titanium, zirconium, and lead which are the material of the pyroelectric material layer 9 is produced. The sol is dehydrated into a gel. The pyroelectric material layer 9 which is an inorganic oxide is prepared by heating and firing the gel. Alkoxides or acetates of titanium, zirconium, lead, and other metal components are starting materials. The starting materials are in a sol state. The sols are used in the form of a composition mixed with an organic high polymer. The organic high polymer reduces the possibility of the occurrence of cracks in the pyroelectric material layer 9 by absorbing the residual stress of the pyroelectric material layer 9 during drying and firing.

Subsequently, the upper side of the substrate 2 is coated with the sol composition. Various coating methods or printing methods are used as a coating method. After coating, a film of the sol composition is dried. The film of the sol composition is subjected to natural drying, or is dried via heating at a temperature of 80° C. or greater and 200° C. or less. Subsequently, the film of the sol composition is fired. The film of the sol composition is fired for 10 minutes to 120 minutes at a firing temperature range of 300° C. to 450° C. The film of the sol composition is gelated by firing.

Subsequently, refiring is performed at a different temperature. The film of the sol composition is fired for approximately 0.1 hours to five hours at a firing temperature range of 400° C. to 800° C. A first stage refiring is performed at a temperature range of 400° C. to 600° C. Subsequently, a second stage refiring is performed at temperature range of 600° C. to 800° C. or less. Accordingly, a gel porous thin film is converted into a film made of a crystalline metal oxide. A step from the coating of the starting materials to firing is repeated to stack the films on top of each other. Thereafter, pre-annealing is performed.

Figure 9:
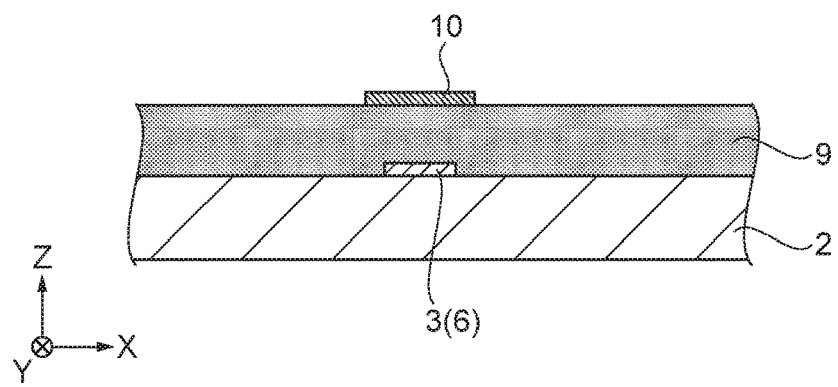
FIG. 9 is a schematic view illustrating the method of manufacturing a piezoelectric element.

Subsequently, as illustrated in FIG. 9, a film made of the material of a mask film is installed on the pyroelectric material layer 9. A mask film 10 is formed by the light exposure, development, and patterning of the film made of the material of the mask film via a photolithographic method. Specifically, first, a photosensitive resist film is installed, a mask having the shape of the piezoelectric body 4 is superimposed on the photosensitive resist, and a resultant object is exposed to light. Subsequently, the resist film is removed via etching, and the mask film 10 is installed. The shape of the mask film 10 is set to follow the shape of the piezoelectric body 4.

Figure 10:
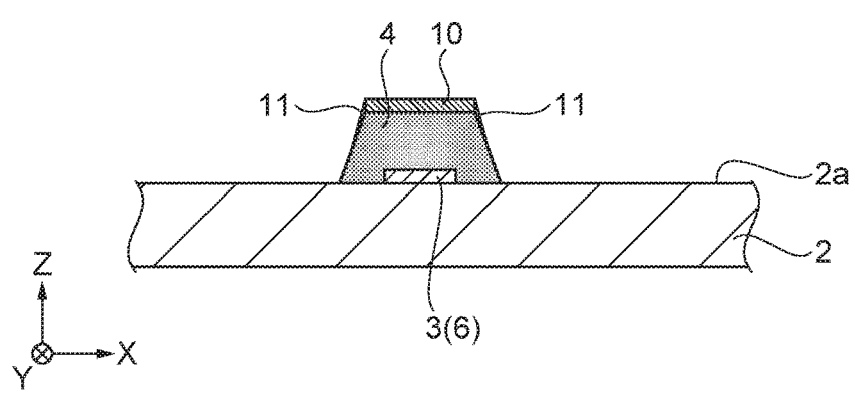
FIG. 10 is a schematic view illustrating the method of manufacturing a piezoelectric element.

As illustrated in FIG. 10, a portion of the pyroelectric material layer 9 masked with the mask film 10 is removed via a dry etching method. The piezoelectric body 4 is etched into a rectangular shape via dry etching. At this time, a front surface of the lower wiring 3 is also slightly etched. When drying etching is performed, chemical reactions occur between etching gas, the mask film 10, and the pyroelectric material layer 9. A compound 11 is formed due to the chemical reactions. If the piezoelectric body 4 has a rectangular shape, the compound 11 are formed along four sides. Side surfaces of the piezoelectric body 4 become substantially perpendicular to an upper surface 2a of the substrate 2 due to the compound 11.

Figure 11:
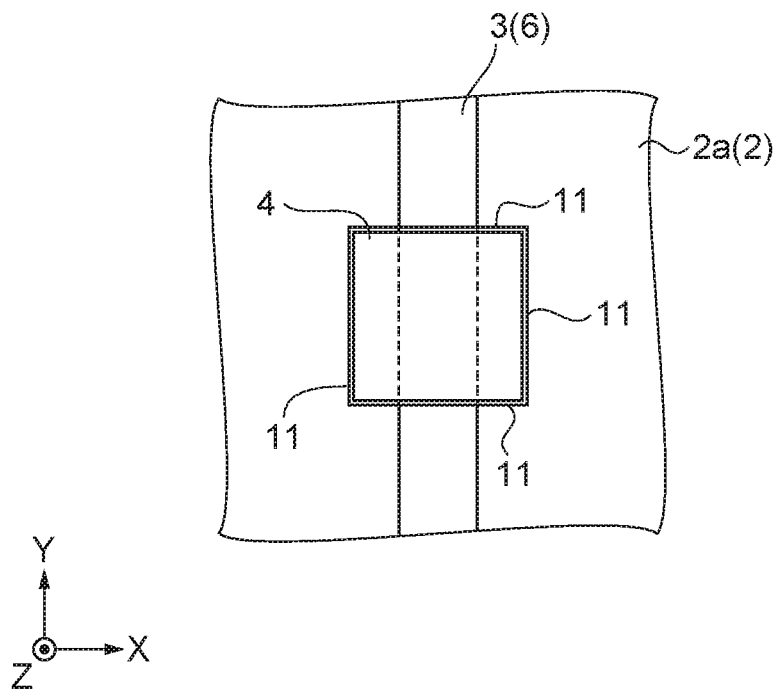
FIG. 11 is a schematic view illustrating the method of manufacturing a piezoelectric element.
Figure 12:
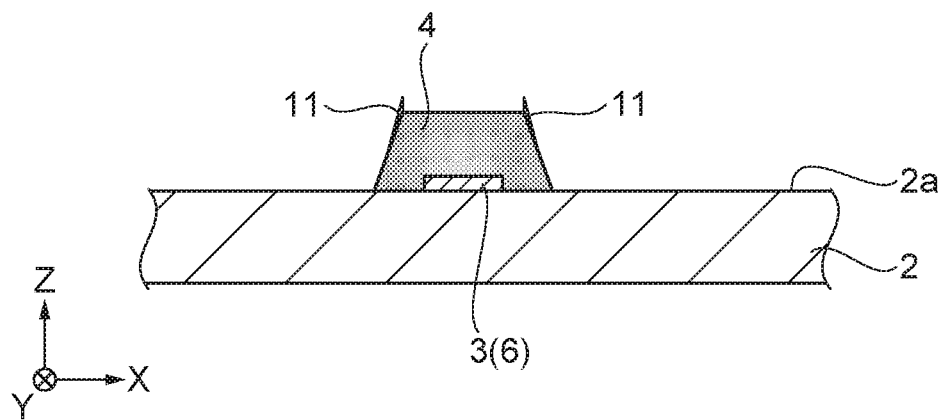
FIG. 12 is a schematic view illustrating the method of manufacturing a piezoelectric element.

As illustrated in FIGS. 11 and 12, the mask film 10 is stripped using a stripping solution. As a result, the lower wiring 3 and the piezoelectric body 4 are formed on the substrate 2. The hard compound 11 is formed on the side surfaces of the piezoelectric body 4.

Figure 13:
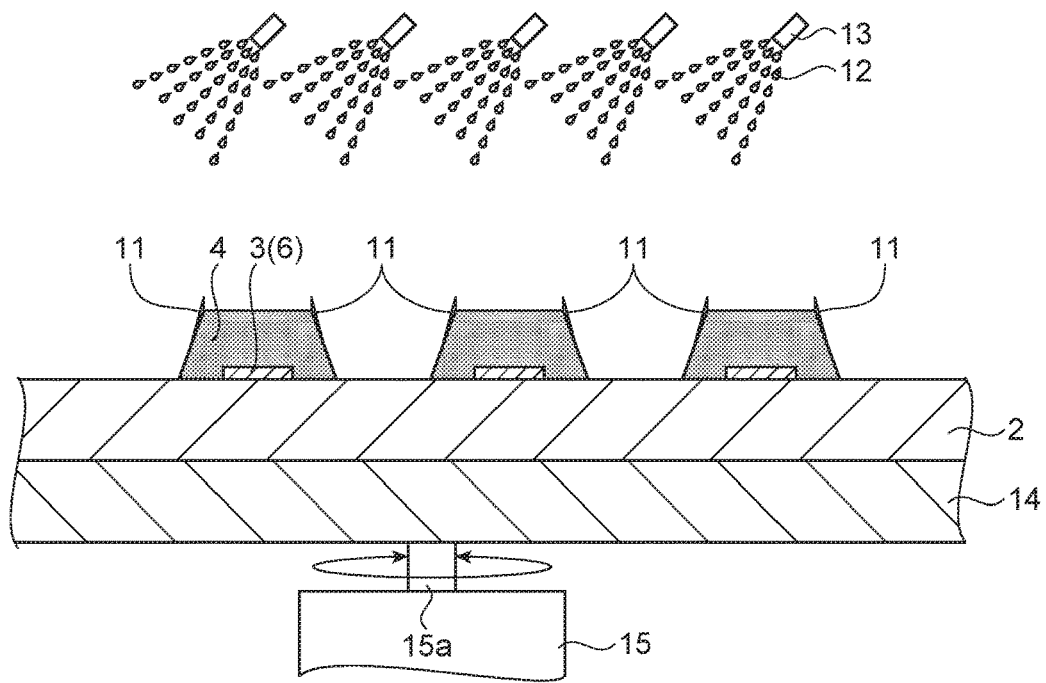
FIG. 13 is a schematic view illustrating the method of manufacturing a piezoelectric element.

Subsequently, as illustrated in FIG. 13, a chemical solution 12 is sprayed to the substrate 2 on which the compound 11 adhering along an exterior is formed. The chemical solution reduces the compound 11, and is preferably prepared according to components of the compound 11. The chemical solution 12 is not limited to a specific solution. In the embodiment, hydrofluoric acid, aqua regia, or the like is used as the chemical solution 12. A resist film may be installed apart from locations to which the compound 11 adheres. The resist film is capable of preventing the reaction of the lower wiring 3 and the upper surface 4i of the piezoelectric body 4 with the chemical solution 12.

Multiple rows of the piezoelectric bodies 4 are disposed on the upper side of the substrate 2. Multiple nozzles 13 are installed at locations facing the substrate 2. The substrate 2 installed on a mounting plate 14, and the mounting plate 14 is fixed to a rotational shaft 15a of a rotational mechanism 15. The rotational mechanism 15 includes a motor, speed reduction gears, and the like. While the rotational mechanism 15 rotates the substrate 2, the nozzles 13 eject the chemical solution 12. The chemical solution 12 is sprayed to the compound 11 at a high speed. A spray direction of the chemical solution 12 from the nozzle 13 is not limited to a specific direction. In the embodiment, the nozzles 13 obliquely eject the chemical solution 12 with respect to a planar direction of the substrate 2. This step is also referred to as slide etching.

Figure 14:
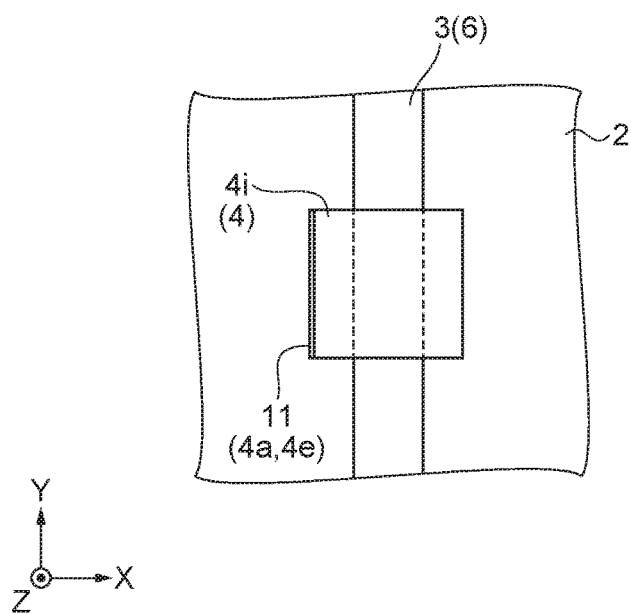
FIG. 14 is a schematic view illustrating the method of manufacturing a piezoelectric element.
Figure 15:
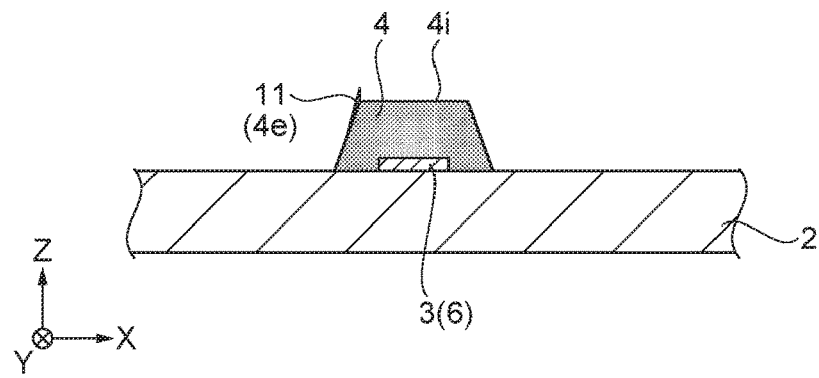
FIG. 15 is a schematic view illustrating the method of manufacturing a piezoelectric element.

As a result, the compound 11 is removed from a large number of the piezoelectric bodies 4. Alternatively, the compound 11 is reduced. As illustrated in FIGS. 14 and 15, the compound 11 remains on a portion of the piezoelectric bodies 4. In many cases, the compound 11 remains on one surface of the four side surfaces of the piezoelectric body 4, and there is almost no incidence of the compound 11 remaining on two or more surfaces. A surface on which the compound 11 remains is not limited to a specific surface of the first side surface 4e to the fourth side surface 4h. There is the possibility of the compound 11 remaining on any surface. In the embodiment, a case in which the compound 11 remains on the first side surface 4e will be described. The same step is performed in a case where the compound 11 remains on the second side surface 4f to the fourth side surface 4h.

Figure 16:
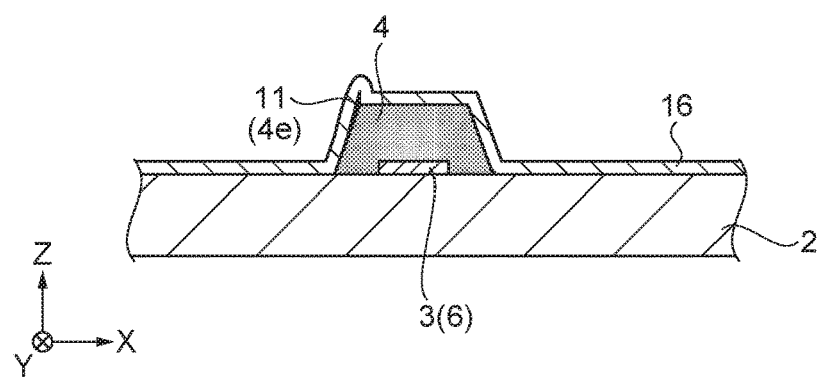
FIG. 16 is a schematic view illustrating the method of manufacturing a piezoelectric element.
Figure 17:
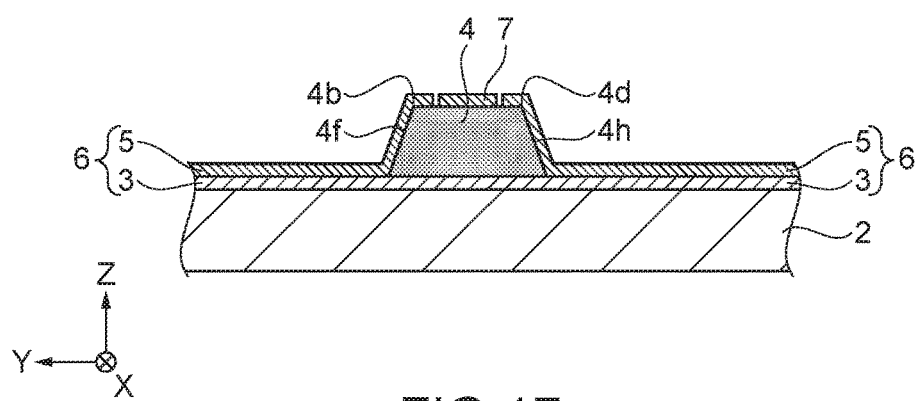
FIG. 17 is a schematic view illustrating the method of manufacturing a piezoelectric element.
Figure 18:
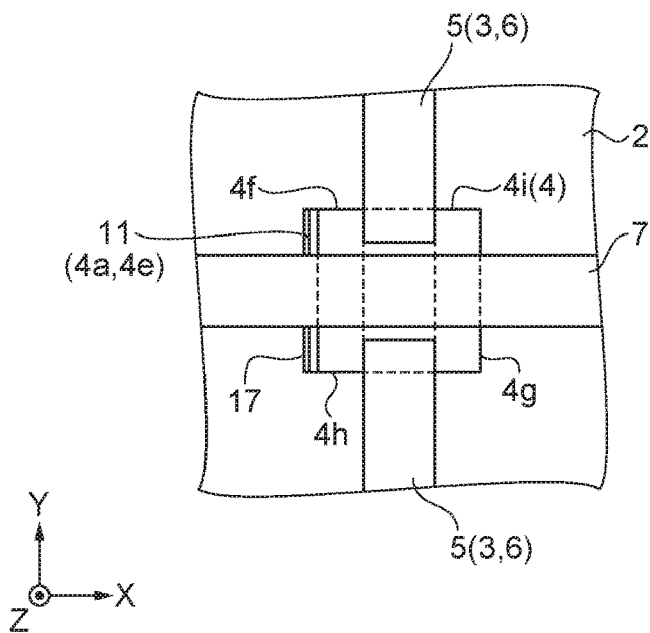
FIG. 18 is a schematic view illustrating the method of manufacturing a piezoelectric element.

FIGS. 16 to 18 are views corresponding to the second electrode installation step which is Step S3. As illustrated in FIG. 16, in Step S3, a metallic film 16 is deposited. The metallic film 16 is a film made of the material of the upper wiring 5 and the second wiring 7. A deposition method for depositing the metallic film 16 is not limited to a specific method. In the embodiment, a sputtering method is used as the deposition method.

Subsequently, a film made of a photosensitive material is deposited on the metallic film 16. Subsequently, a mask film is formed by the light exposure, development, and patterning of this film via a photolithographic method. The shape of the mask film is set to follow the shapes of the first wiring 6 and the second wiring 7. Subsequently, the metallic film 16 masked with the mask film is dry etched. As a result, as illustrated in FIGS. 17 and 18, the upper wiring 5 and the second wiring 7 are formed from the metallic film 16. Since the amount of over-etching in the planar direction is smaller in dry etching in comparison with that in wet etching, it is possible to form a delicate pattern with high accuracy.

In the first wiring 6, the upper wiring 5 is superimposed on the lower wiring 3. Accordingly, even if the thickness of the lower wiring 3 is decreased when the piezoelectric body 4 is patterned, an increase in wiring resistance is prevented by the upper wiring 5. In the embodiment, the first wiring 6 includes the lower wiring 3 and the upper wiring 5. Also, in a configuration in which the upper wiring 5 is not present, the piezoelectric element 1 acts as a piezoelectric element.

Since the compound 11 is present on the first side surface 4e, the first side surface 4e becomes a steep slope surface. For this reason, a residual 17 of the metallic film 16 may remain. The first wiring 6 is installed on the second side surface 4f and the fourth side surface 4h, and the second wiring 7 is installed on the first side surface 4e and the third side surface 4g. Since the first wiring 6 and the second wiring 7 are provided on different sides, one of the first wiring 6 and the second wiring 7 is provided on a side surface having a low probability that the compound 11 remains thereon. The residual 17 of the metallic film 16 does not remain on a side surface on which the compound 11 does not remain. Accordingly, the structure of the piezoelectric element 1 is capable of preventing a short circuit between the first wiring 6 and the second wiring 7 caused by the residual 17 of the metallic film 16.

As described above, in the embodiment, the following effects are obtained.

(1) In the embodiment, the piezoelectric element 1 includes the substrate 2, and the piezoelectric body 4 is provided on the substrate 2. The piezoelectric body 4 includes four sides when viewed from the thickness direction. The first wiring 6 and the second wiring 7 are provided from the piezoelectric body 4 to the substrate 2. When the piezoelectric element 1 is viewed from the thickness direction of the piezoelectric body 4, the sides on which the piezoelectric body 4 is superimposed on the first wiring 6 are different from those on which the second wiring 7 is superimposed on the piezoelectric body 4.

The exterior of the piezoelectric body 4 is formed by installing a resist having the same shape as the exterior shape of the piezoelectric body 4, and performing dry etching. The side surfaces of the piezoelectric body 4 are formed inclined. In this case, the resist, an etching atmosphere, and the material of the piezoelectric body 4 react with each other, and the compound 11 having a protruding shape grows along the exterior of the piezoelectric body 4. The compound 11 protrudes in the thickness direction of the piezoelectric body 4. The side surfaces of the piezoelectric body 4 are at substantially right angles to the plane of the substrate 2 due to the compound 11. The chemical solution 12 is sprayed to remove the compound 11. In this case, a probability of the compound remaining on one side of the four sides is higher than a probability of the compound 11 remaining on two or more sides.

The first wiring 6 and the second wiring 7 are formed by dry etching the same metallic film 16. Since a side surface containing a side on which the compound 11 is present is a steep slope surface, the residual 17 of the metallic film 16 may remain. In the embodiment, since the first wiring 6 and the second wiring 7 are provided on different sides, one of the first wiring 6 and the second wiring 7 is provided on a side surface having a low probability that the compound 11 remains thereon. The residual 17 of the metallic film 16 is unlikely to remain on a side surface on which the compound 11 does not remain. Accordingly, the structure of the piezoelectric element 1 is capable of preventing a short circuit between the first wiring 6 and the second wiring 7 caused by the residual 17 of the metallic film 16.

(2) In the embodiment, the piezoelectric body 4 includes the first side 4a and the second side 4b when viewed from the thickness direction. The first side 4a is orthogonal to the second side 4b. Since a normal direction of the first side 4a is different from that of the second side 4b, it is possible to increase a probability of removing the compound 11 from one side by spraying the chemical solution 12 to the sides.

(3) In the embodiment, the first wiring 6 includes the lower wiring 3 and the upper wiring 5. The lower wiring 3 is provided on the substrate 2, and the piezoelectric body 4 is provided on the lower wiring 3. The upper wiring 5 is provided from the upper side of the piezoelectric body 4 to the upper side of the lower wiring 3. When the piezoelectric body 4 is provided, the shape of the piezoelectric body 4 is formed via etching. Even if the thickness of the lower wiring at a location where the piezoelectric body 4 is not superimposed on the lower wiring 3 is decreased via etching, the upper wiring 5 is capable of preventing a decrease in resistance of the first wiring 6.

(4) In the embodiment, the exterior of the piezoelectric body 4 provided on the substrate 2 is formed to include four sides via dry etching. The side surfaces of the piezoelectric body 4 are formed inclined. In this case, the resist, an etching atmosphere, and the material of the piezoelectric body 4 react with each other, and the compound 11 having a protruding shape grows along the exterior of the piezoelectric body 4. The compound 11 protrudes in the thickness direction of the piezoelectric body 4. The side surfaces of the piezoelectric body 4 are at substantially right angles to the plane of the substrate 2 due to the compound 11.

A process of spraying the chemical solution 12 is performed to reduce the compound 11 along the exterior of the piezoelectric body 4. In this case, a probability of the compound remaining on one side of the four sides is higher than a probability of the compound 11 remaining on two or more sides. Subsequently, the first wiring 6 and the second wiring 7 are installed on different sides.

The upper wiring 5 and the second wiring 7 are formed by dry etching the same metallic film 16. Since a side surface containing a side on which the compound 11 is present is a steep slope surface, the residual 17 of the metallic film 16 may remain. In the embodiment, since the first wiring 6 and the second wiring 7 are provided on different sides, one of the first wiring 6 and the second wiring 7 is provided on a side surface on which the compound 11 does not remain. The residual 17 of the metallic film 16 does not remain on a side surface on which the compound 11 does not remain. Accordingly, the structure of the piezoelectric element 1 is capable of preventing a short circuit between the first wiring 6 and the second wiring 7 caused by the residual 17 of the metallic film 16.

(5) In the embodiment, the first wiring 6 contains the lower wiring 3 and the upper wiring 5. The lower wiring 3 is installed on the substrate 2 before the exterior of the piezoelectric body 4 is formed. The piezoelectric body 4 is installed on the lower wiring 3. Subsequently, the upper wiring 5 is installed from the upper side of the piezoelectric body 4 to the upper side of the lower wiring 3. When the upper wiring 5 is installed, the shape of the upper wiring 5 is formed via etching. The upper wiring 5 is capable of preventing an increase in electric resistance of the lower wiring 3 which is caused by a decrease in the thickness of the lower wiring 3 due to the etching of the piezoelectric body 4.

Second Embodiment

Figure 19:
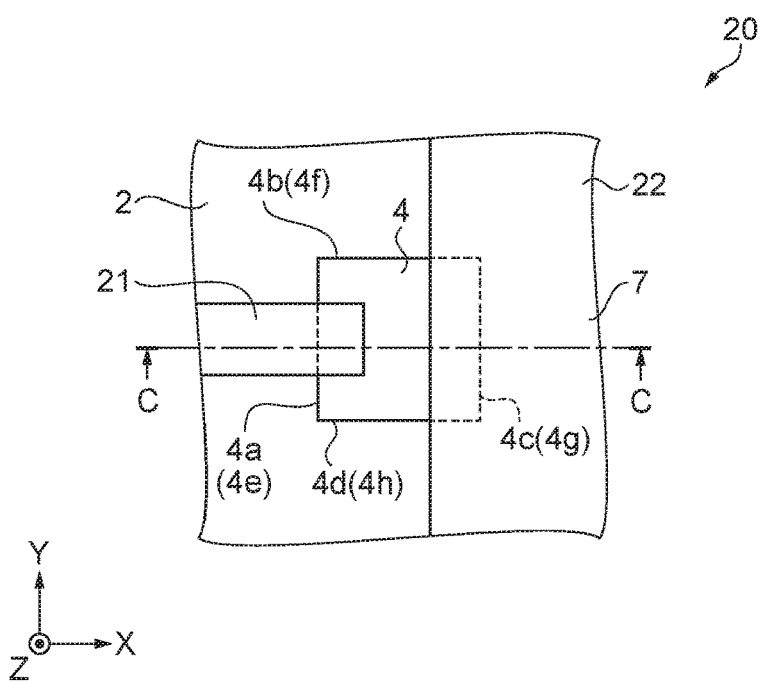
FIG. 19 is a schematic top view illustrating the structure of a piezoelectric element of a second embodiment.
Figure 20:
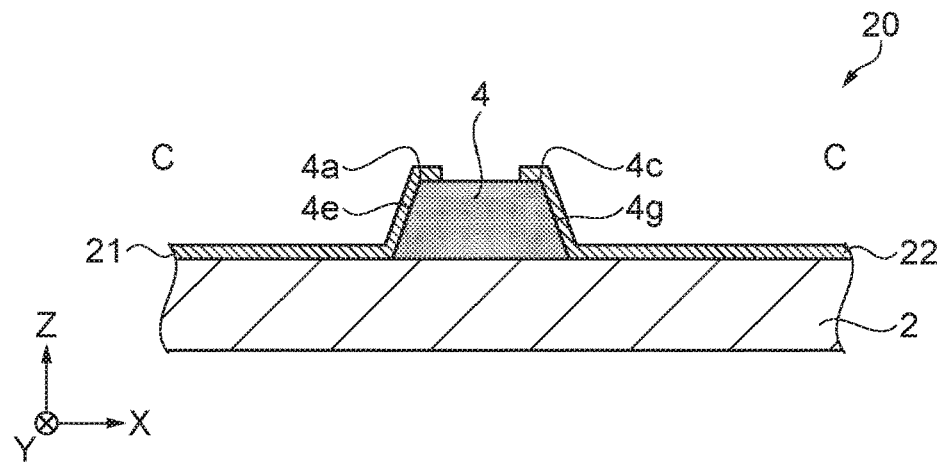
FIG. 20 is a schematic side sectional view illustrating the structure of the piezoelectric element.

Hereinafter, an embodiment of a piezoelectric element will be described with reference to FIGS. 19 and 20. FIG. 19 is a schematic top view illustrating the structure of the piezoelectric element. FIG. 20 is a schematic side sectional view illustrating the structure of the piezoelectric element, and is a side view taken along line C-C in FIG. 19. The embodiment is different from the first embodiment in that the shapes of first wiring and the second wiring are different from those in the first embodiment. Description of the same points as those in the first embodiment will be omitted.

That is, as illustrated in FIG. 19, in a piezoelectric element 20 of the embodiment, the piezoelectric body 4 is installed on the substrate 2. A first wiring 21 and a second wiring 22 are installed in the piezoelectric element 20. The first wiring 21 is installed while being superimposed on the first side 4a. The second wiring 22 is installed while being superimposed on the second side 4b, the third side 4c and the fourth side 4d.

Accordingly, a side on which the first wiring 21 is superimposed on the piezoelectric body 4 is different from sides on which the second wiring 22 is superimposed on the piezoelectric body 4. Even if the residual 17 of the metallic film 16 is present on any side surface of the first side surface 4e to the fourth side surface 4h, it is possible to prevent a short circuit between the first wiring 21 and the second wiring 22.

Third Embodiment

Figure 21:
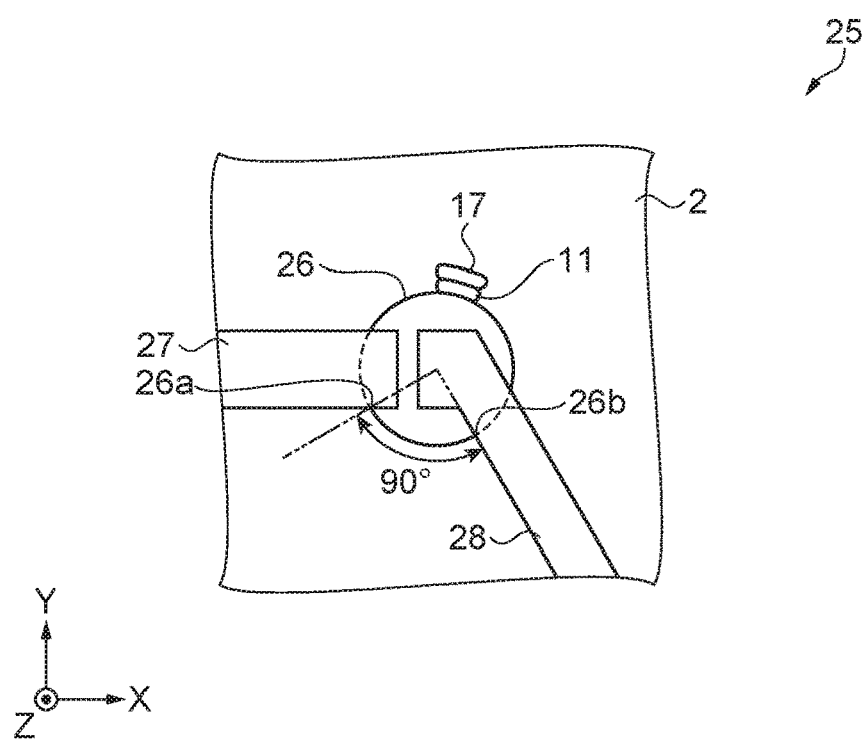
FIG. 21 is a schematic top view illustrating the structure of a piezoelectric element of a third embodiment.
Figure 22:
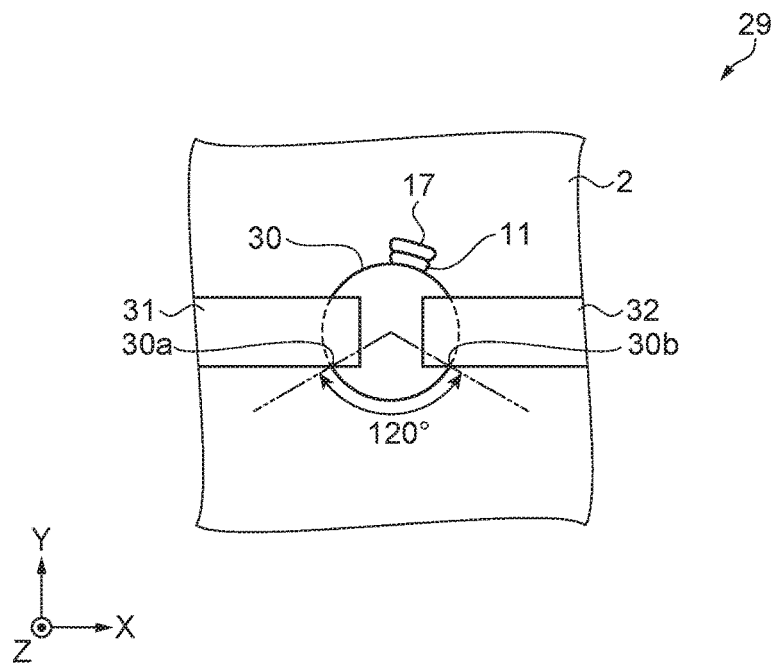
FIG. 22 is a schematic top view illustrating the structure of the piezoelectric element.
Figure 23:
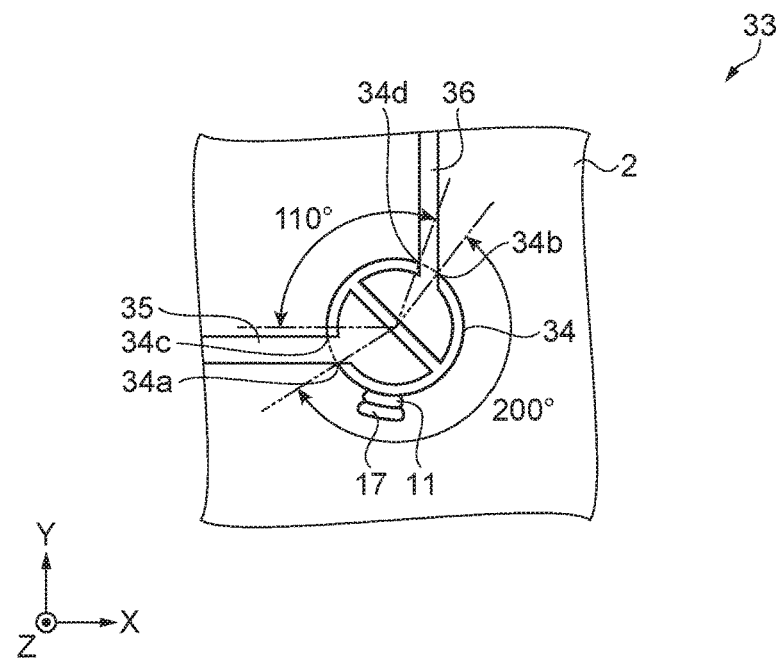
FIG. 23 is a schematic top view illustrating the structure of the piezoelectric element.

Hereinafter, an embodiment of a piezoelectric element will be described with reference to FIGS. 21 to 23. FIGS. 21 to 23 are schematic top views illustrating the structure of the piezoelectric element. The embodiment is different from the first embodiment in that the planar shape of a piezoelectric body is different from that in the first embodiment. Description of the same points as those in the first embodiment will be omitted.

That is, as illustrated in FIG. 21, in a piezoelectric element 25 of the embodiment, a piezoelectric body 26 is installed on the substrate 2. The piezoelectric body 26 has a curved exterior when viewed from the thickness direction. A first wiring 27 and a second wiring 28 are installed in the piezoelectric element 25. The first wiring 27 is installed from a first position 26a on the piezoelectric body 26 to the substrate 2. The second wiring 28 is installed from a second position 26b on the piezoelectric body 26 to the substrate 2. The angle formed by a normal direction of the exterior at the first position 26a and a normal direction of the exterior at the second position 26b is 90 degrees.

The exterior of the piezoelectric body 26 is formed by installing the mask film 10 having the same shape as the exterior shape of the piezoelectric body 26, and performing dry etching. In this case, the mask film 10, an etching atmosphere, and the material of the piezoelectric body 26 react with each other, and the compound 11 having a protruding shape grows along the exterior of the piezoelectric body 26. The compound 11 protrudes in the thickness direction of the piezoelectric body 26. Side surfaces of the piezoelectric body 26 are at substantially right angles to the plane of the substrate 2 due to the compound 11. The chemical solution 12 is sprayed to reduce the compound 11. In a case where the angle formed by the normal direction of the exterior at the first position 26a and the normal direction of the exterior at the second position 26b is set to 90 degrees or greater and 270 degrees or less, it is possible to decrease a probability of the compound remaining on both sides in comparison with that in a case where the angle is an acute angle.

The first wiring 27 and the second wiring 28 are formed by dry etching the same metallic film 16. Since a side surface containing a side on which the compound 11 is present is a steep slope surface, the residual 17 of the metallic film 16 may remain. In the embodiment, since the first wiring 27 and the second wiring 28 are provided on sides facing different directions, one of the first wiring 27 and the second wiring 28 is provided on a side surface having a high probability that the compound does not remain thereon. The residual 17 of the metallic film 16 does not remain on a side surface on which the compound 11 does not remain. Accordingly, the structure of the piezoelectric element 25 is capable of preventing a short circuit between the first wiring 27 and the second wiring 28 caused by the residual 17 of the metallic film 16.

As illustrated in FIG. 22, in a piezoelectric element 29, a piezoelectric body 30 is installed on the substrate 2. A first wiring 31 and a second wiring 32 are installed in the piezoelectric body 30. The first wiring 31 is installed from a first position 30a on the piezoelectric body 30 to the substrate 2. The second wiring 32 is installed from a second position 30b on the piezoelectric body 30 to the substrate 2. The angle formed by a normal direction of the exterior at the first position 30a and a normal direction of the exterior at the second position 30b is 120 degrees. Accordingly, the structure of the piezoelectric element 29 is capable of preventing a short circuit between the first wiring 31 and the second wiring 32 caused by the residual 17 of the metallic film 16.

As illustrated in FIG. 23, in a piezoelectric element 33, a piezoelectric body 34 is installed on the substrate 2. A first wiring 35 and a second wiring 36 are installed in the piezoelectric element 33. The first wiring 35 is installed from a first position 34a on the piezoelectric body 34 to the substrate 2. The second wiring 36 is installed from a second position 34b on the piezoelectric body 34 to the substrate 2. The angle formed by a normal direction of the exterior at the first position 34a and a normal direction of the exterior at the second position 34b is 200 degrees.

In addition, the first wiring 35 is installed from a third position 34c, which is a first position on the piezoelectric body 34, to the substrate 2. The second wiring 36 is installed from a fourth position 34d, which is a second position on the piezoelectric body 34, to the substrate 2. The angle formed by a normal direction of the exterior at the third position 34c and a normal direction of the exterior at the fourth position 34d is 110 degrees. Accordingly, the structure of the piezoelectric element 33 is capable of preventing a short circuit between the first wiring 35 and the second wiring 36 caused by the residual 17 of the metallic film 16.

Fourth Embodiment

Hereinafter, an embodiment of an ultrasonic device in which a piezoelectric element is installed will be described with reference to FIGS. 24 to 26. Description of the same points as those in the first embodiment will be omitted.

Figure 24:
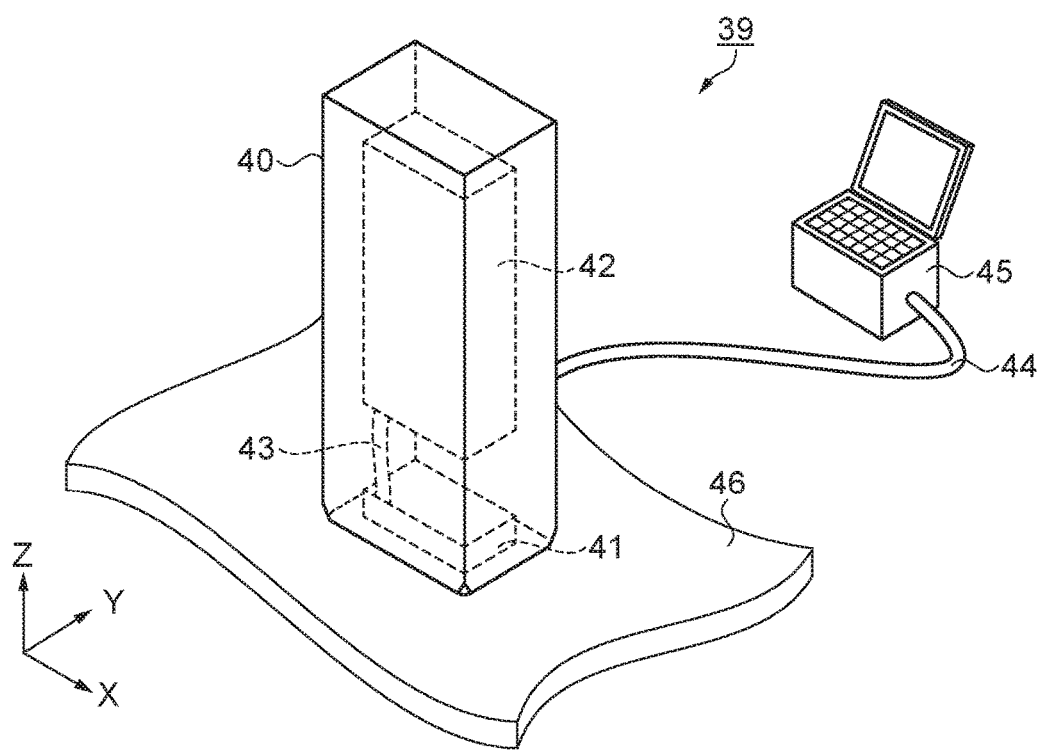
FIG. 24 is a schematic perspective view illustrating the configuration of an ultrasonic device of a fourth embodiment.

FIG. 24 is a schematic perspective view illustrating the configuration of the ultrasonic device. As illustrated in FIG. 24, an ultrasonic device 39 includes an ultrasonic probe 40. The ultrasonic probe 40 has a substantially rectangular parallelepiped shape which is long in one direction. A longitudinal direction of the ultrasonic probe 40 is referred to as a Z direction. A surface of the ultrasonic probe 40 in a −Z direction is a substantially flat surface, and has a rectangular planar shape. Extending directions of two orthogonal sides of the planar shape are respectively referred to as an X direction and a Y direction.

An ultrasonic sensor 41 is installed to face the −Z direction of on a side of the ultrasonic probe 40. The ultrasonic sensor 41 is exposed from a housing on a surface of the ultrasonic probe 40 which faces the −Z direction. A drive unit 42 which drives the ultrasonic sensor 41 is installed inside the ultrasonic probe 40, and the ultrasonic sensor 41 is connected to the drive unit 42 via a cable 43.

The ultrasonic probe 40 is connected to a control device 45 via a cable 44. The control device 45 is a device that receives data signals output from the ultrasonic probe 40 and analyzes the data signals for display.

The ultrasonic probe 40 is used while being pressed against a surface of a living body 46. The ultrasonic probe 40 emits ultrasonic waves toward the living body 46 via the ultrasonic sensor 41. The ultrasonic sensor 41 receives reflected waves reflected by the inside of the living body 46. Since the length of time taken for waves to be reflected and to return differs depending on reflecting surfaces, it is possible to detect an internal structure of the living body 46 in a non-destructive manner by analyzing the length of time taken for the reflected waves to return. Data signals of the reflected waves received by the ultrasonic sensor 41 are transmitted to the control device 45 via the cable 43, the drive unit 42, and the cable 44. The control device 45 receives and analyzes the data signals of the reflected waves. The control device 45 converts the internal structure of the living body 46 into an image, and displays the image.

Figure 25:
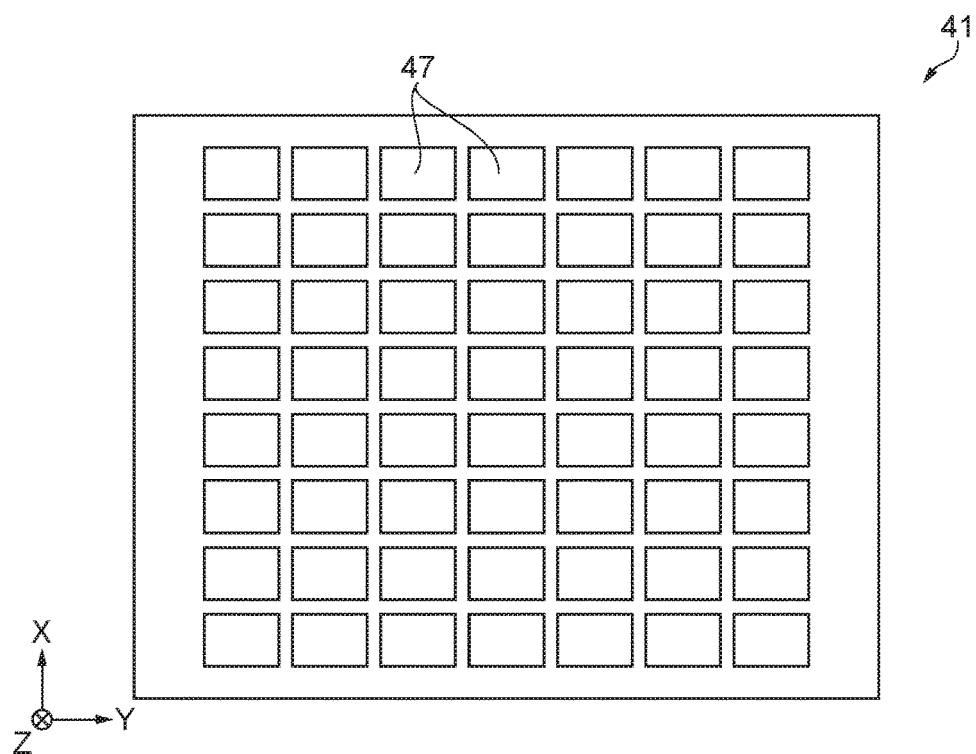
FIG. 25 is a schematic top view illustrating the disposition of a piezoelectric element in an ultrasonic sensor.

FIG. 25 is a schematic top view illustrating the disposition of piezoelectric elements in the ultrasonic sensor. As illustrated in FIG. 25, when the ultrasonic sensor 41 is viewed from the −Z direction, piezoelectric elements 47 are disposed in a matrix pattern. The piezoelectric element 47 contains an element outputting ultrasonic waves and an element receiving ultrasonic waves.

Figure 26:
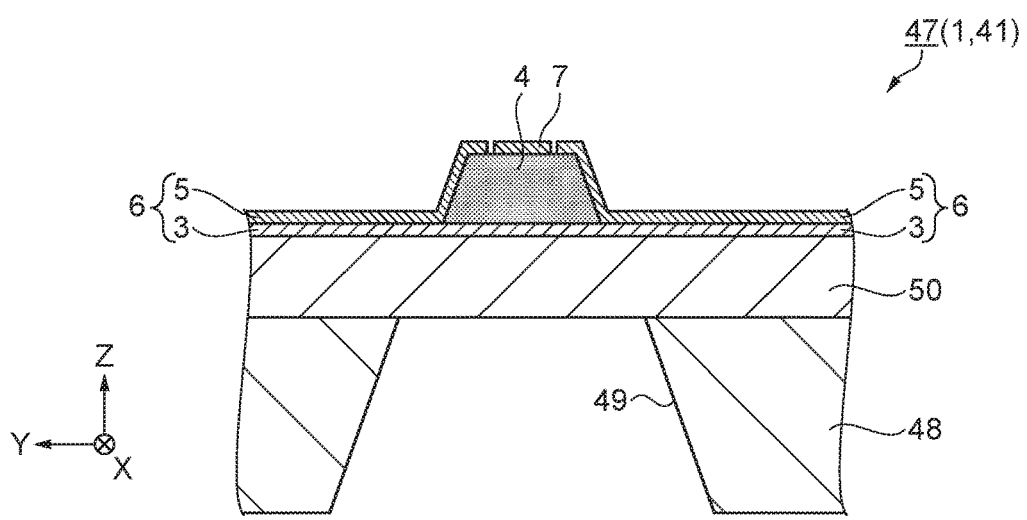
FIG. 26 is a schematic side sectional view illustrating the structure of the piezoelectric element.

FIG. 26 is a schematic side sectional view illustrating the structure of the piezoelectric element. As illustrated in FIG. 26, the ultrasonic sensor 41 includes a substrate 48. The substrate 48 is a silicon substrate, and a recessed portion 49 is formed. A vibrating plate 50 is installed on one surface of the substrate 48. The vibrating plate 50 includes a lower layer and an upper layer. The lower layer is formed of silicon oxide, and the upper layer is formed of zirconium oxide. The piezoelectric element 47 is installed on the vibrating plate 50.

The piezoelectric body 4 is installed on the vibrating plate 50. The piezoelectric body 4 and the lower wiring 3 are installed on the vibrating plate 50 in a state where the piezoelectric body 4 is superimposed on the lower wiring 3, and the upper wiring 5 and the second wiring 7 are installed on the vibrating plate 50 in a state where the upper wiring 5 is superimposed on the second wiring 7. The piezoelectric element 47 installed on the vibrating plate 50 has the same structure as that of the piezoelectric element described in the first embodiment. Accordingly, the piezoelectric element 47 has a structure in which a short circuit between wirings is prevented.

If a pulse signal is applied between the first wiring 6 and the second wiring 7, the piezoelectric body 4 vibrates in an expanding and contracting manner. Accordingly, the vibrating plate 50 vibrates and emits ultrasonic waves. If the piezoelectric element 47 is irradiated with ultrasonic waves, the vibrating plate 50 vibrates, and the piezoelectric body 4 expands and contracts. In this case, a voltage corresponding to vibration is generated between the first wiring 6 and the second wiring 7. Accordingly, the piezoelectric element 47 is capable of emitting and receiving ultrasonic waves.

As described above, in the embodiment, the following effects are obtained.

(1) In the embodiment, the ultrasonic device 39 includes the piezoelectric element 47. The piezoelectric element 47 includes the vibrating plate 50, and the vibrating plate 50 vibrates and outputs ultrasonic waves. An element having the same structure as that of the piezoelectric element 1 is provided on the vibrating plate 50. Accordingly, a short circuit between wirings in the piezoelectric element 47 is prevented. As a result, the ultrasonic device 39 can be configured as a device including the piezoelectric element 47 in which a short circuit between wirings is prevented.

The invention is not limited to the aforementioned embodiments. Persons skilled in the technical field can change or improve the embodiments in the technical concept of the invention. Hereinafter, modification examples will be described.

MODIFICATION EXAMPLE 1

In the first embodiment, the planar shape of the piezoelectric body 4 is a rectangular shape. Alternatively, the planar shape maybe a triangular shape or a polygonal shape having corners, the number of which is more than or equal to that of a pentagonal shape. Also, in this case, it is possible to prevent a short circuit between wirings caused by the residual 17 of the metallic film 16 by installing the wirings on different sides.

MODIFICATION EXAMPLE 2

In the first embodiment, two wirings are installed on the piezoelectric body 4. Three or more wirings may be installed on the piezoelectric body 4. Also, in this case, it is possible to prevent a short circuit between the wirings caused by the residual 17 of the metallic film 16 by installing the wirings on different sides.

MODIFICATION EXAMPLE 3

In the fourth embodiment, the piezoelectric element 1 of the first embodiment is used as the piezoelectric element 47. Alternatively, the piezoelectric element 20 of the second embodiment may be used rather than the piezoelectric element 47. The piezoelectric element 25, the piezoelectric element 29, or the piezoelectric element 33 of the third embodiment may be used rather than the piezoelectric element 47. Also, in this case, it is possible to prevent a short circuit between wirings.

The entire disclosure of Japanese Patent Application No. 2015-232820 filed Nov. 30, 2015 is expressly incorporated by reference herein.

What is claimed is:

1. A piezoelectric element comprising:
   a substrate;
   a piezoelectric body that is provided on the substrate and that has a curved exterior in a plan view;
   a first wiring that is provided from a first position on the piezoelectric body to the substrate; and
   a second wiring that is provided from a second position on the piezoelectric body to the substrate,
   wherein an angle formed by a normal direction of an exterior at the first position and a normal direction of an exterior at the second position is more than 90 degrees and is equal to or less than 270 degrees.

2. An ultrasonic device comprising:
a vibrating plate that outputs ultrasonic waves; and
the piezoelectric element according to claim 1 the piezoelectric element vibrating the vibrating plate.

* * * * *